United States Patent
Okazaki (10) Patent No.: US 8,678,619 B2
(45) Date of Patent: Mar. 25, 2014

(54) LIGHT EMITTING DEVICE

(75) Inventor: Tomokazu Okazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 969 days.

(21) Appl. No.: 11/922,257

(22) PCT Filed: Jun. 14, 2005

(86) PCT No.: PCT/JP2005/010827
§ 371 (c)(1),
(2), (4) Date: Dec. 14, 2007

(87) PCT Pub. No.: WO2006/134635
PCT Pub. Date: Dec. 21, 2006

(65) Prior Publication Data
US 2010/0290233 A1    Nov. 18, 2010

(51) Int. Cl.
*F21V 7/00*    (2006.01)

(52) U.S. Cl.
USPC ............ 362/311.01; 362/249.01; 362/133.02; 362/249.02; 257/98

(58) Field of Classification Search
USPC ................... 362/208, 255, 294, 310, 311.01, 362/311.02, 335, 363, 408, 455, 509, 54, 362/249.01, 249.02, 249.16, 545; 257/95–100, 676, 706–708, 712, 257/717–720, 722, E33.067, E33.068, 257/E33.056, E33.059, E33.073–E33.075; 438/26, 27, 29, 106, 116, 123, 125, 438/126, 127
See application file for complete search history.

(56) References Cited

U.S. PATENT DOCUMENTS

| | | | | |
|---|---|---|---|---|
| 5,136,366 A | * | 8/1992 | Worp et al. ................... | 257/687 |
| 5,424,531 A | * | 6/1995 | O'Regan et al. .............. | 250/216 |
| 5,909,054 A | * | 6/1999 | Kozono ........................ | 257/667 |
| 6,365,920 B1 | * | 4/2002 | Abramov et al. .............. | 257/81 |
| 6,392,294 B1 | * | 5/2002 | Yamaguchi ................... | 257/690 |
| 6,541,800 B2 | * | 4/2003 | Barnett et al. ................. | 257/98 |
| 6,590,235 B2 | * | 7/2003 | Carey et al. .................... | 257/98 |

(Continued)

FOREIGN PATENT DOCUMENTS

| | | |
|---|---|---|
| JP | 2-110503 | 4/1990 |
| JP | 9-83018 | 3/1997 |
| JP | 9-281374 | 10/1997 |

OTHER PUBLICATIONS

International Search Report from the corresponding PCT/JP2005/010827, mailed Jul. 19, 2005.

*Primary Examiner* — Hargobind S Sawhney
(74) *Attorney, Agent, or Firm* — Hamre, Schumann, Mueller & Larson, P.C.

(57) ABSTRACT

A light emitting device includes light transmitting resin loaded between a lens and a light emitting element. The structure of the device enables the lens to be fixed to a required position without reducing the light transmittance. The light emitting device 1 includes a light emitting element 2 and a separate lens 3 supported by a support member 4. The lens 3 is fixed to the support member 4 by hardening the resin 13 between the element 2 and the lens 3 in the support member 4. Mutually engaging male and female portions are provided between the support member 4 and the lens 3. N male portions (n is a positive integer) are provided for (n+α) female portions (α is a positive integer). The female portions allow the resin 13 to communicate with the outside of the device. The α female portions serve as a leak portion for discharging the resin 13 or bubbles to the outside when the lens 3 is fixed.

12 Claims, 6 Drawing Sheets

(56) References Cited

U.S. PATENT DOCUMENTS

| | | | |
|---|---|---|---|
| 6,653,724 B1 * | 11/2003 | Kim et al. | 257/684 |
| 6,831,372 B2 * | 12/2004 | Ruhland | 257/783 |
| 6,924,514 B2 * | 8/2005 | Suenaga | 257/98 |
| 7,075,114 B2 * | 7/2006 | Abe et al. | 257/98 |
| 7,104,672 B2 * | 9/2006 | Zhang | 362/308 |
| 7,138,667 B2 * | 11/2006 | Barnett et al. | 257/99 |
| 7,358,599 B2 * | 4/2008 | Ohe et al. | 257/678 |
| 7,703,950 B2 * | 4/2010 | Ewert et al. | 362/339 |
| 7,763,478 B2 * | 7/2010 | Loh et al. | 438/22 |
| 2005/0072981 A1 * | 4/2005 | Suenaga | 257/88 |
| 2005/0247990 A1 * | 11/2005 | Cheng | 257/432 |
| 2006/0044806 A1 * | 3/2006 | Abramov et al. | 362/337 |

\* cited by examiner

LIGHT EMITTING DEVICE

TECHNICAL FIELD

The present invention relates to a light emitting device incorporating a light emitting element and a lens.

BACKGROUND ART

A light emitting device constituted by a conventionally known arrangement include a light emitting element such as a light emitting diode (LED), and a lens, where the light emitting element and the lens are attached to a common support. In this connection, Patent Document 1, for example, discloses a structure whereby the support is formed with a recess, and the light emitting element is fixed to the bottom of the recess. A support surface for supporting the lens is provided at an intermediate portion of the recess as viewed in the depth direction, so that the light emitting element and the lens are spaced from each other by a predetermined distance. In the structure of the Patent Document 1, light transmitting resin is filled in the light transmitting region between the lens and the light emitting element, so that the lens is fixed to the support.

Patent Document 1: JP-A-H09-83018 (FIG. 1)

DISCLOSURE OF THE INVENTION

Problems to be Solved by the Invention

In the above-described light emitting device including a light emitting element and a lens, the distance between the light emitting element and the lens or the deviation of the optical axis affects the light emitting performance. Thus, it is important to accurately fix the lens at a predetermined position.

However, in the case where the lens is bonded by the light transmitting resin loaded between the light emitting element and the lens, the lens may float or lean off the predetermined position if an excessive amount of resin is loaded into the recess. In such an instance, the lens cannot be fixed as designed, and hence, the intended lens function does not result.

If the amount of the resin loaded in the recess is too small, on the other hand, or if bubbles are trapped between the lens and the bonding resin, the bonding strength for the lens is insufficient, whereby uniform light transmittance is not obtainable.

The present invention has been proposed to solve the above-described problems, and its object is to provide a light emitting device including light transmitting resin between the lens and the light emitting element and having a structure facilitating the fixation of the lens at a required position without causing the deterioration of the light transmittance.

Means for Solving the Problems

To achieve the object, a light emitting device of the present invention defined in claim 1 comprises a light emitting element and a lens which are spaced from each other and supported by a support. The lens is fixed to the support by hardening the light transmitting resin loaded in a space between the light emitting element and the lens in the support. A male portion and a female portion which are to be fitted to each other are provided between the support and the lens. The number of the male portions is n (where n is a positive integer), whereas the number of the female portions is (n+α) (where α is a positive integer). The female portions extend from a side of the light transmitting resin to the outside for providing communication therebetween, and the α female portion or portions serve as a leak portion for discharging the light transmitting resin or bubbles to the outside in fixing the lens.

According to the present invention defined in claim 2, in the light emitting device as set forth in claim 1, the lens is positioned to the support by male/female fitting of the n set or sets of male portion and female portion.

According to the present invention defined in claim 3, in the light emitting device as set forth in claim 1 or 2, the support is formed with a recess having a bottom surface to which the light emitting element is fixed. The lens is fixed at an intermediate portion of the recess in the depth direction of the recess. The light transmitting resin is loaded in a space of the recess between the light emitting element and the lens.

According to the present invention defined in claim 4, in the light emitting device as set forth in claim 3, the intermediate portion of the recess in the depth direction is formed with a support surface for supporting a surface of the lens on a light emitting element side. The male portion and the female portion are provided between the surface of the lens on the light emitting element side and the support surface.

According to the present invention defined in claim 5, in the light emitting device as set forth in claim 3, the male portion and the female portion are provided between a side surface of the lens and an inner side surface of the recess.

Advantages of the Invention

According to the present invention of claim 1, male portions and female portions are provided between the lens and the support, and the number of the female portions is larger than the number of the male portions by α. Thus, by utilizing the α female portions left without fitting to the male portions as the leak portions, the excess of the light transmitting resin or bubbles can be easily discharged to the outside. As a result, a proper amount of light transmitting resin is loaded between the lens and the light emitting element without leaving space. Thus, a proper distance is defined between the lens and the light emitting element, so that the desired light emitting performance is obtained.

Since the leak portion is provided by utilizing a female portion for fitting, it is not necessary to additionally provide a leak portion. Since the number of female portions is larger than that of the male portions, the number of positions to which the male portions can be fitted is large, which facilitates the work for finding the fitting position in mounting the lens.

According to the present invention of claim 2, the lens is reliably and easily positioned relative to the support by the male/female fitting of n set or sets of male portion and female portion.

According to the present invention of claim 3, the light emitting element and the lens are arranged in the recess, so that the light transmitting resin is easily loaded.

According to the present invention of claim 4, the lens is fixed at a proper position of the support surface provided at an intermediate portion of the recess in the depth direction.

According to the present invention of claim 5, the lens is fixed while being properly positioned relative to the inner side surface of the recess.

DESCRIPTION OF THE REFERENCE SIGNS 1, 101, 201 Light emitting device
2 Light emitting element
3 Lens
4 Support member
5 Base member
6 Case
7 Recess
8a, 8b Electrode
9 Metal wire
10 Support surface
11 Main body
12 Flange
13 Light transmitting resin
20 Hole
21 Shaft
24 Slit
25 Rib
30 Groove
31 Rib
32 Clearance

BEST MODE FOR CARRYING OUT THE INVENTION

Figure 1:
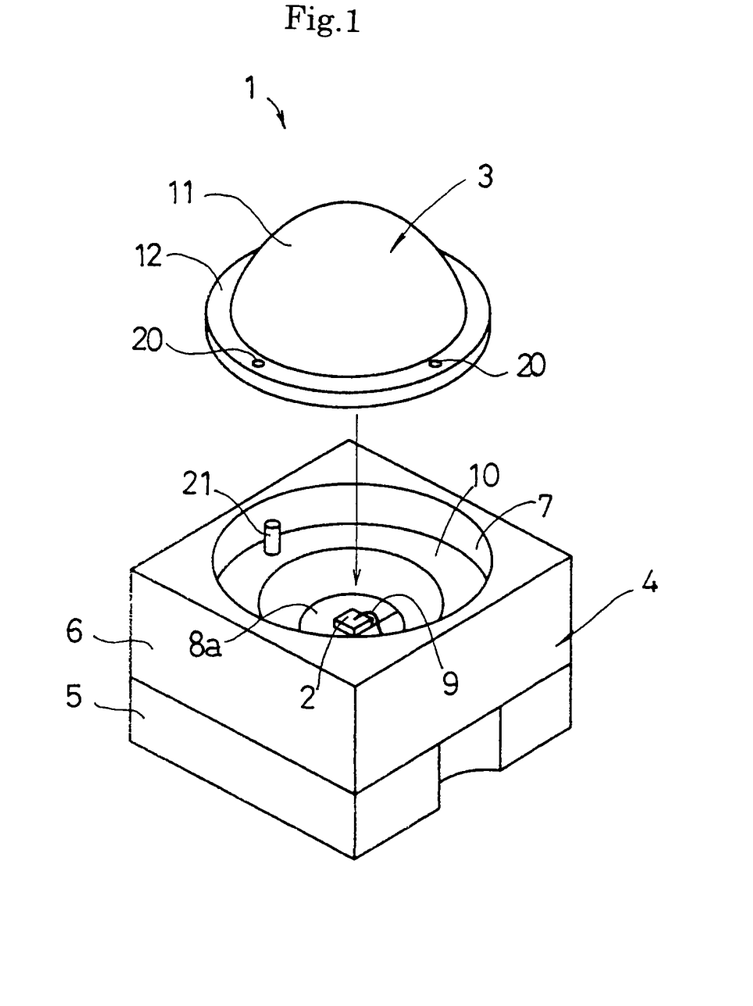
FIG. 1 is an exploded perspective view of a first embodiment of the present invention.
Figure 2:
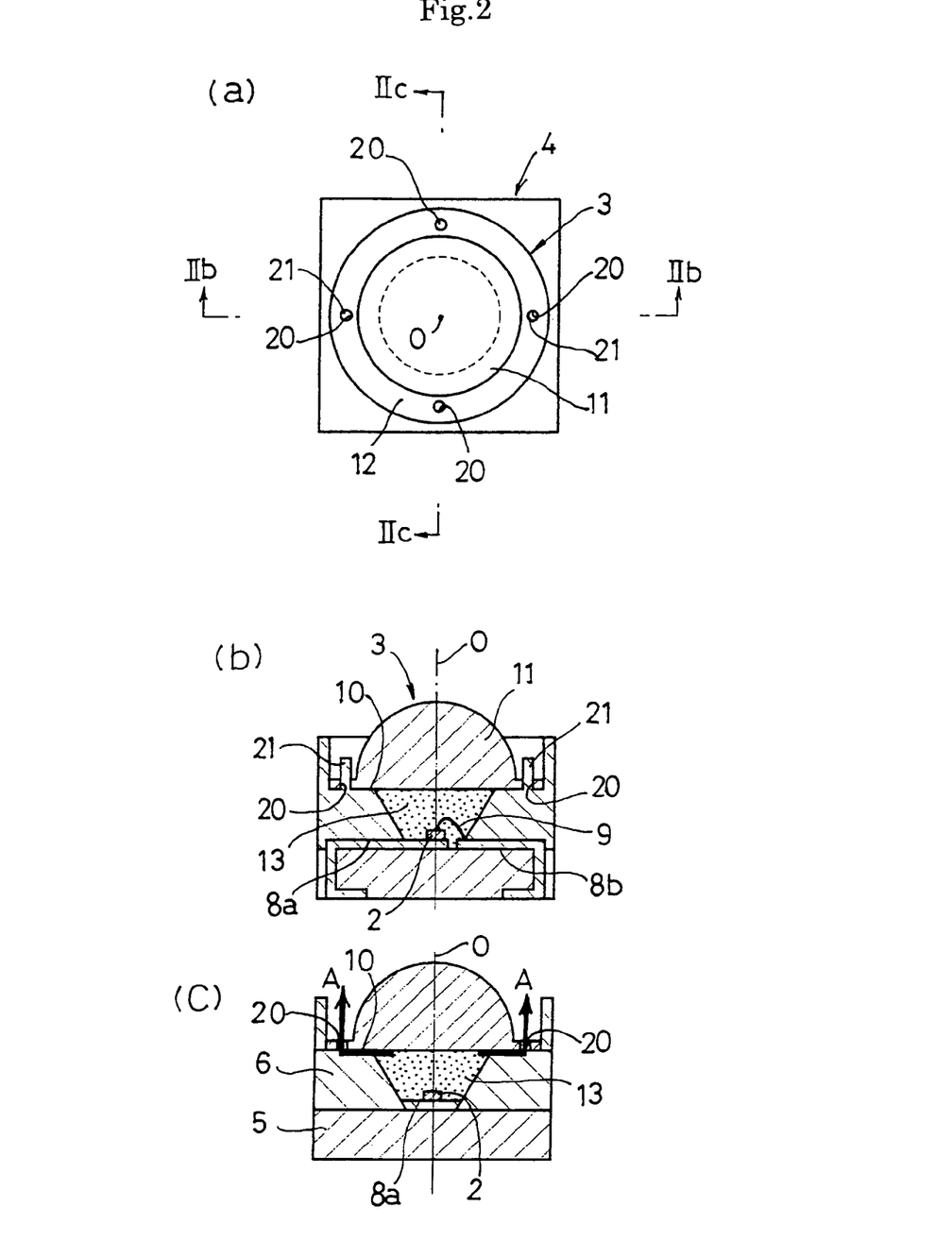
FIG. 2(a) is a plan view of the first embodiment.
FIG. 2(b) is a sectional view taken along lines IIb-IIb in FIG. 2(a)
FIG. 2(c) is a sectional view taken along lines IIc-IIc in FIG. 2(a).

Preferred embodiments of the present invention will be described below with reference to the accompanying drawings. FIGS. 1 and 2 show a first embodiment.

The light emitting device 1 according to the first embodiment includes a light emitting element 2 and a lens 3, both of which are supported by a support member 4. Light emitted from the light emitting element 2 passes through the lens 3 and goes out.

The support member 4 includes a base member 5 in the form of a flat plate made of an insulating material on which the light emitting element 2 is mounted, while also including a case 6 which is made of an insulating material and fixed to the upper surface of the base member 5 so that it surrounds the light emitting element 2. The case 6 is formed with a through-hole, where the diameter of the upper opening of the through-hole is larger than that of the lower opening. As the case 6 is mounted on the upper surface of the base member 5, the resulting support member 4 has a recess 7 which is upwardly open at the center of the support member.

As shown in FIG. 2(b), the upper surface of the base member 5 is formed with a pair of electrodes 8a and 8b. The light emitting element 2, which may be a light emitting diode (LED) chip, is electrically and mechanically connected to the electrode 8a, while also being electrically connected to the electrode 8b through a thin metal wire 9 provided by a wire-bonding method.

The lens 3 is a plano-convex lens having a generally hemi-spherical main body 11 and an annular flange 12 formed integrally around the main body. The case 6 includes a support surface 10 provided at an intermediate portion of the recess 7 in the depth direction and extending in parallel with the upper surface of the base member 5. The lens 3 is so mounted that the flat surface thereof is oriented downward and supported by the support surface 10, whereby the lens is spaced from the light emitting element 2 by a predetermined distance. The lens 3 is so arranged that the central axis thereof corresponds to the central axis of the light emitting element 2. (Hereinafter, this is referred to as the central axis O.)

The space, between the light emitting, element 2 and the lens 3 in the recess 3 is filled with light transmitting resin 13. The light transmitting resin 13 serves to bond the lens 3 to the support surface 10 of the support member 4, while allowing the light emitted from the light emitting element 3 to pass therethrough and impinge on the lens 3. As the light transmitting resin 13, an epoxy resin may be used.

The lens 3 and the support member 4 are provided with mutually fitted male and female portions. A total of n male portions (n is a positive integer) may be provided, while a total of (n+α) female portions (α is a positive integer) may be provided. In the illustrated embodiment, the lens 3 is formed with holes 20 as the female portions, whereas the support surface 10 is provided with shafts 21 as the male portions.

Specifically, the lens 3 is formed with four (n+α=4) holes 20 penetrating the upper and the lower surfaces of the flange 12. As shown in FIG. 2(a), the four holes 20 are arranged at positions which divide the circumference of a circle around the central axis O into four equal parts. The support surface 10 is formed with two (n=2) shafts 21. As shown in FIG. 2(b), the shafts 21 are arranged to fit into two holes 20 arranged to face each other across the central axis O. Since n=2 in this embodiment, α is equal to 2.

With the above arrangement, when the lens 3 is mounted at a proper position of the support surface 10, two holes 20 are left without fitting to the shafts and serve as passages for providing communication between the upper side and the lower side of the flange 12. These holes serve as leak portions for discharging the excess amount of the supplied light transmitting resin 13 or bubbles existing at the interface between the lens 3 and the light transmitting-resin 13.

In manufacturing the light emitting device according to the above-described first embodiment, the light transmitting resin 13 is loaded into the recess 7 of the support member 4 to cover the light emitting element 2. Specifically, a relatively large amount of light transmitting resin 13 is loaded so that the resin bulges above the support surface 10. Then, the lens 3 is placed on the support surface 10 while pressing the upper surface of the transparent resin 13. In placing the lens, the two shafts 21 on the support surface 10 are fitted into two of the four holes 20. In this way, by the male/female fitting of the two sets of holes 20 and shafts 21, the lens 3 is properly positioned relative to the support member 4. In placing the lens 3, the positions of the holes 20 may be deviated from the positions of the shafts 21. Even in such a case, the proper fitting position is found quickly by turning the lens 3 through an angle of not more than 90°, because adjacent holes 20 are 90° apart from each other with respect to the central axis, although the shafts 21 are 180° apart from each other.

Due to the pressing by the lens 3, the excess of the light transmitting resin 13 loaded in the recess 7 flows out onto the support surface 10 and is discharged to the outside through the remaining two holes (leak portions) 20 which are not utilized for the male/female fitting (see the arrow A in FIG. 2(c)). The bubbles existing at the interface between the light transmitting resin 13 and the lens 3 is also discharged to the outside through the holes 20.

Thus, in the light emitting device 1 of the first embodiment, by the provision of the holes 20 serving as the leak portions, the space between the lens 3 and the light emitting element 2 is completely filled with the light transmitting resin 13. Further, the lens 3 is bonded to the support surface 10 while snugly fitting to the surface. That is, the lens 3 is reliably fixed as designed without inclining with respect to the support surface 10 or floating above the support surface. Further, the deviation of the optical axis is prevented. Thus, the light emitting performance of the light emitting element 2 is not deteriorated by the light transmitting resin, so that desired lens effect is obtained. Since a gap is not defined under the lens 3, the adhesion of the lens is enhanced.

Since the leak portion is provided by utilizing a female portion for male/female fitting, it is not necessary to additionally form a leak portion. Due to the existence of the female portion to serve as the leak portion, the number of female portions is larger than the number of male portions. Thus, the number of the positions to which the male portions can be fitted increases, which facilitates the mounting of the lens 3.

A second embodiment of the present invention will be described below with reference to FIGS. 3 and 4. The elements which are identical or similar to those of the first embodiment are designated by the same reference signs as those used for the first embodiment, and the description thereof will be omitted.

The light emitting device 101 of the second embodiment includes a light emitting element 2, a lens 3 and a support member 4 for supporting these. Similarly to the first embodiment, the light emitted from the light emitting element 2 passes through the lens 3 for emission to the outside.

In the second embodiment again, male portions and female portions which are to be fitted to each other are provided between the lens 3 and the support member 4. Specifically, in this embodiment, two (n=2) ribs 25 as the male portions are formed at the support surface 10, whereas four (n+α=4) slits 24 as the female portions are formed at the lens 3, as shown in FIG. 3. Thus, n=2 and α=2 in this embodiment.

Figure 3:
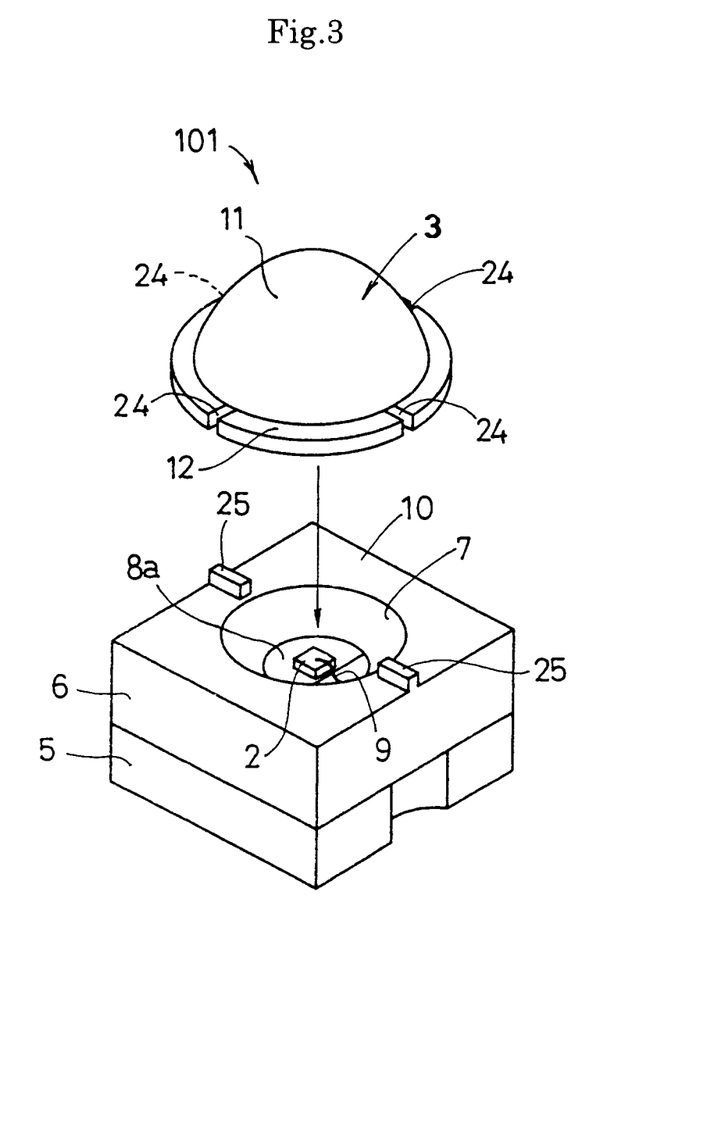
FIG. 3 is an exploded perspective view of a second embodiment of the present invention.
Figure 4:
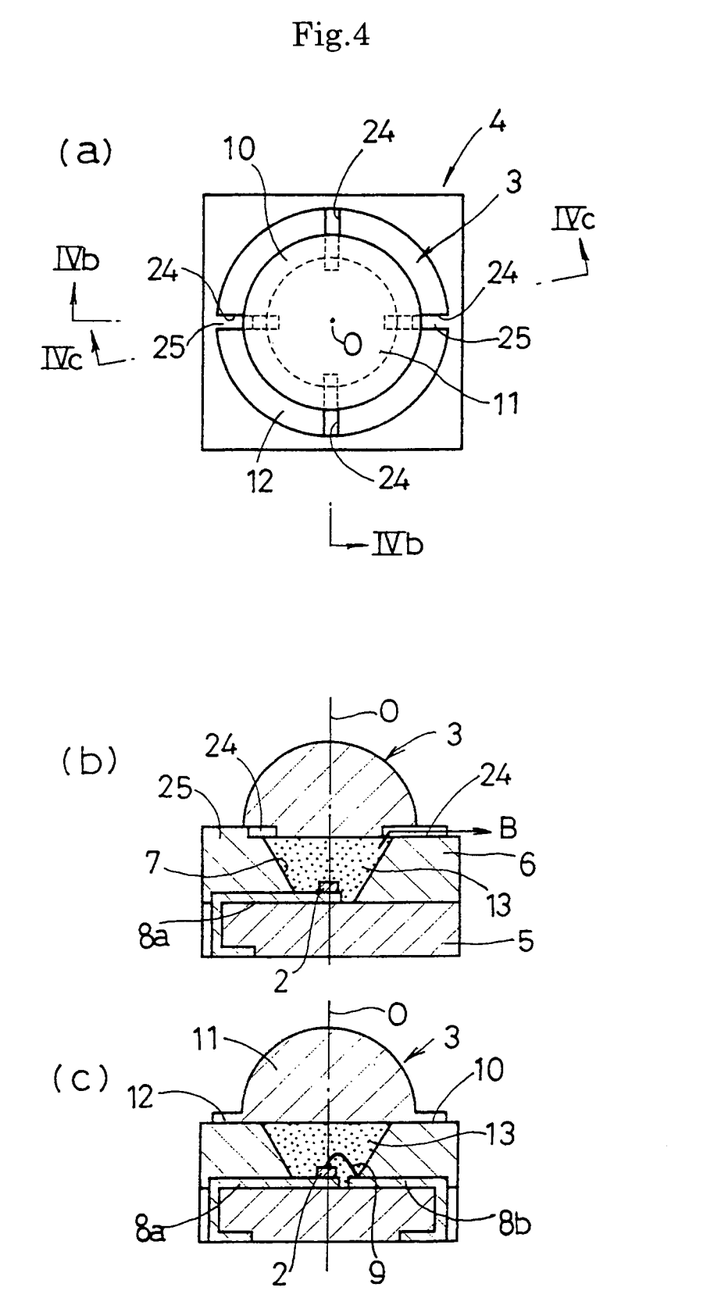
FIG. 4(a) is a plan view of the second embodiment.
FIG. 4(b) is a sectional view taken along lines IVb-IVb of FIG. 4(a) and FIG. 4(c) is a sectional view taken along lines IVc-IVc in FIG. 4(a).

As shown in FIG. 3, in the second embodiment, the support surface 10 is flush with the upper end of the recess 7. The ribs 25, which are linear in a plan view, are arranged on the support surface 10 along a line passing through the central axis O while being spaced from each other.

The slits 24 as the female portions are formed at positions which divide the outer circumference of the flange 12 of the lens 3 into four equal parts and extend from the circumference toward the central axis O. The four slits 24 open downward at the lower surface of the main body 11 of the lens 3, and the inner end of each slit is located on the portion in which the light transmitting resin 13 is loaded (see the arrow B in FIG. 4(b)).

As described above, for the two male portions (ribs 25), four female portions (slits 24) are provided. Thus, when the lens 3 is mounted at a proper position of the support surface 10, two slits 24 are left without fitting to the ribs. The two slits 24 serve as leak portions.

In the second embodiment, by the male/female fitting of the two sets of slits 24 and ribs 25, the lens 3 is properly positioned relative to the support member 4. The excess of the light transmitting resin 13 and bubbles in the recess 7 are discharged to the outside through the remaining two slits (leak portions) 24 which are not utilized for male/female fitting (see the arrow B in FIG. 4(b)). In this way, the same advantages as those of the first embodiment are obtained.

In this embodiment, the support surface 10 is flush with the upper end of the recess 7, and the ribs 25 are formed on the support surface 10. Unlike this, the support surface 10 may be formed at an intermediate portion of the recess 7. In this case, the ribs 25 as the male portions may be formed to project integrally from the inner surface of the recess 7 toward the central axis O.

Figure 5:
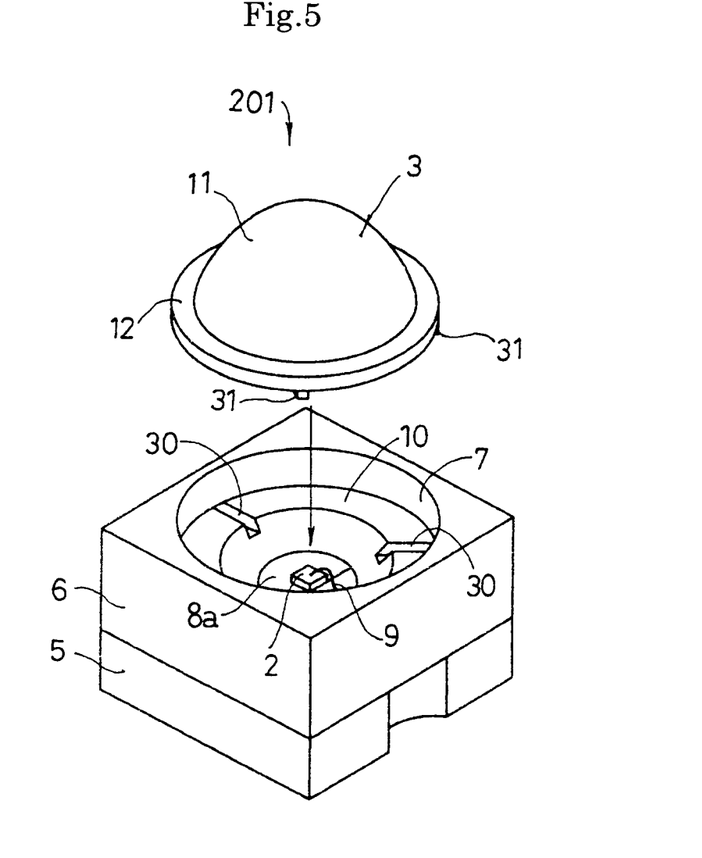
FIG. 5 is an exploded perspective view of a third embodiment of the present invention.
Figure 6:
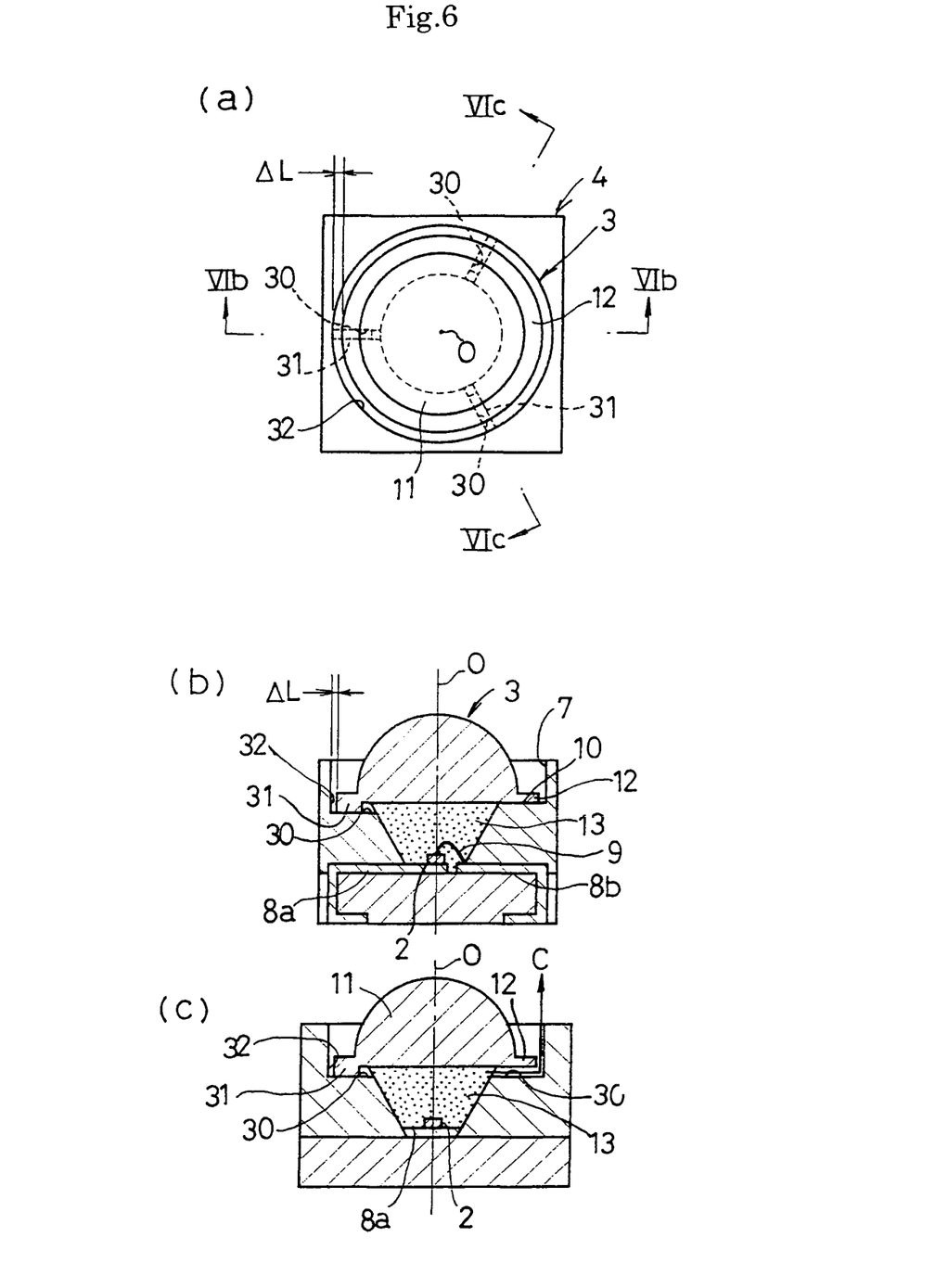
FIG. 6(a) is a plan view of the third embodiment.
FIG. 6(b) is a sectional view taken along lines VIb-VIb in FIG. 6(a)
FIG. 6(c) is a sectional view taken along lines VIc-VIc in FIG. 6(a).

A third embodiment of the present invention will be described below with reference to FIGS. 5 and 6. The elements which are identical or similar to those of the first embodiment are designated by the same reference signs as those used for the first embodiment, and the description thereof will be omitted.

The light emitting device 201 of the third embodiment includes a light emitting element 2, a lens 3 and a support member 4 for supporting these. Similarly to the first embodiment, the light emitted from the light emitting element 2 passes through the lens 3 for emission to the outside.

In the third embodiment again, male portions and female portions which are to be fitted to each other are provided between the lens 3 and the support member 4. In the third embodiment, grooves 30 as the female portions are formed at the support surface 10, whereas ribs 31 as the male portions are formed at the lens 3, as shown in FIG. 5.

Specifically, three (n+α=3) grooves 30 are formed at the support surface 10. As shown in FIG. 6(a), the grooves 30 are linear and extend radially from the central axis O side. The adjacent ones of the grooves 30 are 120° apart from each other with respect to the central axis. Further, two (n=2) ribs 31 are formed on the lower surface of the lens 3 to project vertically to fit into any two of the three grooves 30. Thus, n=2 and α=1 in this embodiment.

When the lens 3 is mounted at a proper position of the support member 4 by the male/female fitting of the grooves 30 and the ribs 31, a small clearance 32 of ΔL is defined between the outer circumference of the flange 12 of the lens 3 and the inner circumference of the recess 7.

With this structure, when the lens 3 is mounted at a proper position of the support surface 10, one of the grooves 30 is left without fitting to the rib and communicates with the outside through the clearance 32. Thus, this groove serves as a leak portion.

In the third embodiment, by the male/female fitting of the two sets of grooves 30 and ribs 31, the lens 3 is properly positioned relative to the support member 4. Due to the pressing by the lens 3, the excess of the light transmitting resin 13 and bubbles in the recess 7 are discharged to the outside through the remaining one groove 30 which is not utilized for the male/female fitting and the clearance 32 (see the arrow C in FIG. 6(c)). In this way, the same advantages as those of the first embodiment are obtained.

The present invention is not limited to the first through the third embodiments. For instance, the shape, number (n and α) and arrangement of the male portions and female portions may be varied appropriately.

The invention claimed is:
1. A light emitting device comprising:
 a support member including a recess having an inner circumferential surface;
 a light emitting element disposed in the recess; and
 a lens disposed in the recess for covering the light emitting element;
 wherein the lens includes a flange having an outer circumferential surface; and wherein a clearance is formed between the outer circumferential surface of the flange of the lens and the inner circumferential surface of the recess of the support member;

wherein the lens is fixed to the support member by hardening of light transmitting resin filled in the recess between the light emitting element and the lens;

wherein the device further comprises male and female engaging portions to be fitted to each other between the support member and the lens;

wherein the male engaging portions include only n number of male portions (where n is a positive integer), whereas the female engaging portions include n+α female portions (where α is a positive integer) allowing the light transmitting resin to communicate with an outside of the device, all n number of male portions being removably engaged to n number of female portions when the lens is assembled to the support member, and the α female portions serve as a leak portion for discharging the light transmitting resin or bubbles to the outside when the fixing of the lens is performed; and wherein all of the n+α female engaging portions are spaced from an optical axis of the lens by an equal distance for allowing each of the n male portions to be fitted to any selected one of all n+α female engaging portions.

2. The light emitting device according to claim 1, wherein the clearance is circularly annular and has a constant width along the entire outer circumferential surface of the flange.

3. The light emitting device according to claim 1, wherein the lens is positioned to the support member by n sets of male and female portions fitted to each other.

4. The light emitting device according to claim 1, wherein the recess has a bottom surface to which the light emitting element is fixed, the lens being fixed at an intermediate portion of the recess in a depth direction of the recess.

5. The light emitting device according to claim 4, wherein the intermediate portion of the recess in the depth direction is formed with a support surface for supporting a surface of the lens on a light emitting element side, and the male portions and the female portions are provided between the surface of the lens on the light emitting element side and the support surface.

6. The light emitting device according to claim 4, wherein the male portions and the female portions are provided between a side surface of the lens and an inner side surface of the recess.

7. The light emitting device according to claim 1, wherein all of the n male engaging portions are spaced from the optical axis of the lens by a same distance as the n+α female engaging portions.

8. The light emitting device according to claim 1, wherein each of the male portions comprises a rib, and each of the female portions comprises a groove for fitting to the rib.

9. The light emitting device according to claim 1, wherein the recess includes a support surface at an intermediate height of the recess, each of the male portions comprising a rib formed integrally with the lens, and each of the female portions comprising a groove formed in the support surface for fitting to the rib.

10. A light emitting device comprising:
a support member including a recess having an inner circumferential surface;
a light emitting element disposed in the recess; and
a lens disposed in the recess for covering the light emitting element;
wherein the lens is fixed to the support member by hardening of light transmitting resin filled in the recess between the light emitting element and the lens;
wherein the device further comprises male and female engaging portions to be fitted to each other between the support member and the lens;
wherein the male engaging portions include only n number of male portions (where n is a positive integer), whereas the female engaging portions include n+α female portions (where α is a positive integer) allowing the light transmitting resin to communicate with an outside of the device, all n number of male portions being removably engaged to n number of female portions when the lens is assembled to the support member, and the α female portions serve as a leak portion for discharging the light transmitting resin or bubbles to the outside when the fixing of the lens is performed; and
wherein all of the n+α female engaging portions are spaced from an optical axis of the lens by an equal distance for allowing each of the n male portions to be fitted to any selected one of all n+α female engaging portions.

11. A light emitting device comprising:
a support member including a recess having an inner circumferential surface;
a light emitting element disposed in the recess; and
a lens disposed in the recess for covering the light emitting element;
wherein the lens is fixed to the support member by hardening of light transmitting resin filled in the recess between the light emitting element and the lens;
wherein the device further comprises male and female engaging portions to be fitted to each other between the support member and the lens;
wherein the male engaging portions include only n number of male portions (where n is a positive integer), whereas the female engaging portions include n+α female portions (where α is a positive integer) allowing the light transmitting resin to communicate with an outside of the device, all n number of male portions being removably engaged to n number of female portions when the lens is assembled to the support member, and the α female portions serve as a leak portion for discharging the light transmitting resin or bubbles to the outside when the fixing of the lens is performed; and
wherein all of the n+α female engaging portions are spaced from an optical axis of the lens by an equal distance for allowing each of the n male portions to be fitted to any selected one of all n+α female engaging portions, and
wherein a pathway is formed between the support member and the lens, the pathway comprising the α female portion, and being suitable for discharging the light transmitting resin or bubbles to the outside when the fixing of the lens is performed.

12. The light emitting device according to claim 11, wherein the pathway further comprises a clearance formed between the lens and the support member.

* * * * *